United States Patent
Huang (10) Patent No.: US 6,327,691 B1
(45) Date of Patent: Dec. 4, 2001

(54) SYSTEM AND METHOD FOR COMPUTING AND ENCODING ERROR DETECTION SEQUENCES

(75) Inventor: Shay-Jan Huang, Milpitas, CA (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 0 days.

(21) Appl. No.: 09/249,404

(22) Filed: Feb. 12, 1999

(51) Int. Cl.$^7$ .................................................. H03M 13/15
(52) U.S. Cl. .......................................................... 714/781
(58) Field of Search ............................................... 714/781

(56) References Cited

U.S. PATENT DOCUMENTS

| | | | |
|---|---|---|---|
| Re. 31,666 | 9/1984 | Doi et al. | 371/45 |
| 4,206,440 | 6/1980 | Doi et al. | 371/39 |
| 4,467,444 * | 8/1984 | Harmon, Jr. et al. | 364/900 |
| 4,567,594 * | 1/1986 | Deodhar | 371/38 |
| 4,726,028 | 2/1988 | Himeno | 371/37 |
| 4,796,261 | 1/1989 | Moriwaki | 371/40 |
| 4,881,232 | 11/1989 | Sako et al. | 371/37.4 |
| 4,902,882 * | 2/1990 | Lavelle | 235/382 |
| 4,910,736 | 3/1990 | Tanaka et al. | 371/37.7 |
| 5,051,999 * | 9/1991 | Erhart et al. | 371/41 |
| 5,430,842 * | 7/1995 | Thompson | 395/200 |
| 5,471,486 * | 11/1995 | Baggen et al. | 371/37.1 |
| 5,517,508 | 5/1996 | Scott | 371/37.1 |
| 5,793,779 * | 8/1998 | Yonemitsu et al. | 371/40.2 |

OTHER PUBLICATIONS

Altera Corporation, Solution Brief 30, "crc MegaCore Function Parameterized CRC Generator/Checker", Aug. 1997, ver 1.*

Ritter, T., "The Great CRC Mystery", Dr. Dobbs Journal of Software Tools, 11(2) Feb. 1986.*

S. Roberts, "Europe will now use AC–3", web.ukonline.co.uk/s.roberts/euraudio.htm, Jan. 1998.*

Sarwate, D., "Computation of Cyclic Redundancy Checks via Table Look–Up", Communications of the ACM, Aug. 1988, vol. 31, No. 8, pp. 1008–1013.*

Advanced Television Systems Committee, "Digital Audio Compression Standard (AC–3)," ATSC Document A/52, Dec. 20, 1995, pp. 1–130.

* cited by examiner

Primary Examiner—Stephen M. Baker
(74) Attorney, Agent, or Firm—Gregory J. Koerner; Simon & Koerner LLP (57) ABSTRACT

The present invention comprises an efficient system and method for computing and encoding error detection sequences in digital audio encoding. In one embodiment, an AC-3 encoder appends a cyclic redundancy check (CRC) frame check sequence at the front of each data frame. Furthermore, this frame check sequence may be evaluated in the same kind of circuitry that is used to evaluate the CRC frame check sequence appended at the end of each data frame. In one embodiment of the present invention, a shift register contains feedback elements located in reference to a generating polynomial derived from the given generating polynomial for the CRC frame check sequence appended at the end of each data frame. The data bits are sent through the shift register in reverse time order, and, upon sending the last data bit in reverse time order, the shift register contains the required CRC frame check sequence.

30 Claims, 8 Drawing Sheets

SYSTEM AND METHOD FOR COMPUTING AND ENCODING ERROR DETECTION SEQUENCES

BACKGROUND OF THE INVENTION

1. Field of the Invention

This invention relates generally to improvements in digital audio processing, and relates specifically to a system and method for computing and encoding an error detection sequence in digital audio encoding.

2. Description of the Background Art

Digital audio is now in widespread use in digital video disk (DVD) players, digital satellite systems (DSS), and digital television (DTV). Each of these systems has incorporated digital audio compression in order to fit more digital audio in a storage device of limited storage capacity, or to transmit digital audio over a channel of limited bandwidth. As part of the digital audio compression method used, steps must be taken to ensure against errors in the transmission of the data. The transmission may take many forms, including encoding and writing data to a disk and subsequently reading and decoding data from it, or direct radio-frequency broadcast from a encoder and transmitter to a receiver and decoder. In most cases, additional bits may be added by the transmitter (and encoder) to the digital audio data so that the receiver (and decoder) can evaluate the received data for the presence or absence of errors.

A frame check sequence (FCS) is a number which, when appended to a transmitted message, allows the receiver to deduce the presence or absence of errors in transmission. The cyclic redundancy check (CRC) method considers the individual frames of data in a serial bitstream between a transmitter and a receiver to be large binary numbers. The transmitter in the CRC method divides each number by a fixed constant, and then examines the remainders. In the most common practice, these remainders, one example of an FCS, are appended to the end (i.e. the part arriving last in time) of the numbers. These appended numbers are then transmitted to the receiver. The receiver then divides the appended numbers by the same fixed constant previously used by the transmitter. If the new remainders of these divisions are 0, then the receiver may deduce that it received the frames in the serial bitstream without errors.

Because binary division consists primarily of logical shifting of the data bits, a CRC FCS is commonly generated and evaluated using some form of hardware shift-register employing feedback. An advantage of many CRC embodiments which append the FCS at the end of the bitstream is that the same circuit design may be used to both generate the FCS in the transmitter and evaluate the FCS in the receiver. The FCS is generated by shifting the bitstream through the shift-register. The number remaining within the shift-register after the last bit of the bitstream has been shifted into the shift-register is used as the FCS. When this FCS is appended to the end of the bitstream, an identical shift-register in the receiver may be used to evaluate the incoming appended bitstream. After shifting the entire appended bitstream through the receiver's shift-register, if there are no errors from transmission the shift-register should contain binary 0.

One example of a transmitter sending data to a receiver is the digital audio compression method first used by Dolby® Labs. The Advanced Television Systems Committee (ATSC) selected this Dolby® Labs design for use in the digital television (DTV) system (formerly known as high-definition television, or HDTV). This design is set forth in the Audio Compression version 3 (AC-3) specification, document number ATSC A/52 (here after "the AC-3 specification"), which is hereby incorporated by reference. The AC-3 specification has been subsequently selected for Region 1 (North American market) DVD's and selected DSS broadcasts.

The AC-3 specification presents a standard decoder design for digital audio, which allows all AC-3 encoded digital audio recordings to be reproduced by differing vendors' equipment. Certain parts of the encoder design must also be standard in order that the resulting encoded digital audio may be reproduced with the standard decoder design. However, many of the design details in areas, such as the calculation and encoding of one of two cyclic redundancy check (CRC) frame check sequences (FCS), may be left to the individual designer with the requirement that the design does not affect the ability of the resulting encoded digital audio to be reproduced with the standard decoder design.

It is less common to append a FCS at the beginning (i.e. the part arriving first in time), rather than at the end, of a bitstream. However, the AC-3 specification provides for both an appended-at-the-beginning FCS, called CRC1, as well as an appended-at-the-end FCS, called CRC2. Furthermore, the AC-3 specification requires that no matter how CRC1 is generated it must be capable of evaluation using the same shift-register in the decoder as CRC2. No system or method capable of generating CRC1 is disclosed in the AC-3 specification.

Therefore, techniques for generating an appended-at-the-beginning CRC1 which may be evaluated by a standard appended-at-the-end shift-register remains a significant consideration in digital audio operations.

SUMMARY OF THE INVENTION

The present invention includes a system and method for calculating a cyclic redundancy check (CRC) frame check sequence (FCS) which may be appended at the beginning of a frame of digital data in a bitstream and yet be evaluated utilizing the same circuitry that is used to evaluate another CRC FCS appended at the end of the frame. In one embodiment where the bitstream is used for AC-3 digital audio, a special shift register including feedback may be used to calculate a value for the appended-at-the-beginning CRC FCS, referred to as CRC1. When that value for CRC1 is appended at the front of the first ⅝ of a frame of digital data, the appended partial frame may be correctly evaluated for the presence or absence of errors using the evaluation circuitry in a standard AC-3 decoder.

An AC-3 decoder evaluates the frames of digital data in a bitstream for errors by treating each frame as a single binary number, with the bit transmitted first-in-time treated as the most-significant bit (MSB) of the large binary number. This treatment is referred to herein as the forward representation. The AC-3 decoder performs this procedure by dividing the previously-appended binary number by an evaluation constant divisor, and then checking to see if the remainder is 0. In one embodiment of the present invention, the evaluation constant divisor is 11000000000000101 binary (98,309 decimal). Because working with large binary numbers may be cumbersome, a method known as polynomial representation is often used. For example, the above evaluation constant divisor may be represented as $x^{16}+x^{15}+x^2+1$. The variable x in this polynomial is referred to as a dummy variable because it serves as a placeholder for the exponent. In the polynomial representation, the constant divisor is called a generating polynomial.

The present invention may be used to determine that number which, when appended at the front of a frame of digital data in a digital bitstream, will give a 0 remainder when the appended frame is divided by the generating polynomial $x^{16}+x^{15}+x^2+1$. In the present invention, a second alternate treatment of the frame is used in which the bit transmitted last-in-time is treated as the MSB of a large binary number. This treatment is referred to as the backwards representation. A new dummy variable y is introduced to represent divisors when dividing this backwards representation number to extract remainders. When a backwards representation number is divided by a generating constant divisor represented by the generating polynomial $y^{16}+y^{14}+y^1+1$ (i.e. 10100000000000011 binary), the resulting remainder may serve as the desired value of CRC1.

One embodiment of the present invention includes an apparatus which may be used to divide a backwards representation number by the generating polynomial $y^{16}+y^{14}+y^1+1$. In this embodiment, a linear feedback shift-register (LFSR) includes sixteen individual latch elements. In general, each latch element's data input signal connects to the adjacent latch element's data output signal. Exceptions to this connection scheme exist for selected latch elements. In these cases, exclusive-or gates (XOR) add feedback.

In operation of the LFSR, the data bits which will be transmitted during the first ⅝ of the next frame are received and stored in a buffer. The latch elements of the LFSR are reset to each contain 0. The buffer then presents the data bits to the serial data input line of the LFSR in the reverse order to which the data bits will be transmitted. When the last data bit from the buffer is clocked into the LFSR, it contains sixteen data bits which correspond to the remainder of the division of the first ⅝ of data in the exemplary synchronization frame by the backwards representation generating polynomial $y^{16}+y^{14}+y^1+1$. These sixteen data bits in the LFSR may then be written into a buffer and used as CRC1. With the calculation of CRC1 complete, the AC-3 encoder may then proceed with transmitting this frame as the next frame in the AC-3 bitstream. Alternatively, the AC-3 encoder may wait until both CRC1 and the appended-at-the-end CRC FCS have been calculated before proceeding with transmitting the frame in the AC-3 bitstream.

The present invention therefore provides a system and method for computing and encoding an error detection sequence in digital audio encoding.

DETAILED DESCRIPTION OF THE PREFERRED EMBODIMENT

The present invention relates to an improvement in digital signal processing. The following description is presented to enable one of ordinary skill in the art to make and use the invention and is provided in the context of a patent application and its requirements. The present invention is specifically disclosed in the environment of digital audio in Audio Compression version 3 (AC-3) format, performed in an encoder/decoder (CODEC) integrated circuit. However, the present invention may be practiced wherever the necessity for appended-at-the-beginning frame check sequences (FCS) occurs with any form of generating polynomial, and should not be construed as being limited to digital data which contains digital audio data. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention comprises an efficient system and method for computing and encoding error detection sequences in digital audio encoding. In one embodiment, an AC-3 encoder appends a cyclic redundancy check (CRC) frame check sequence at the front of each data frame. Furthermore, this frame check sequence may be evaluated in the same kind of circuitry that is used to evaluate the CRC frame check sequence appended at the end of each data frame. In one embodiment of the present invention, a shift register contains feedback elements located in reference to a generating polynomial derived from the given generating polynomial for the CRC frame check sequence appended at the end of each data frame. The data bits are sent through the shift register in reverse time order, and, upon sending the last data bit in reverse time order, the shift register then contains the required CRC frame check sequence. In other embodiments, the CRC frame check sequence may be calculated by a data processor.

Figure 1:
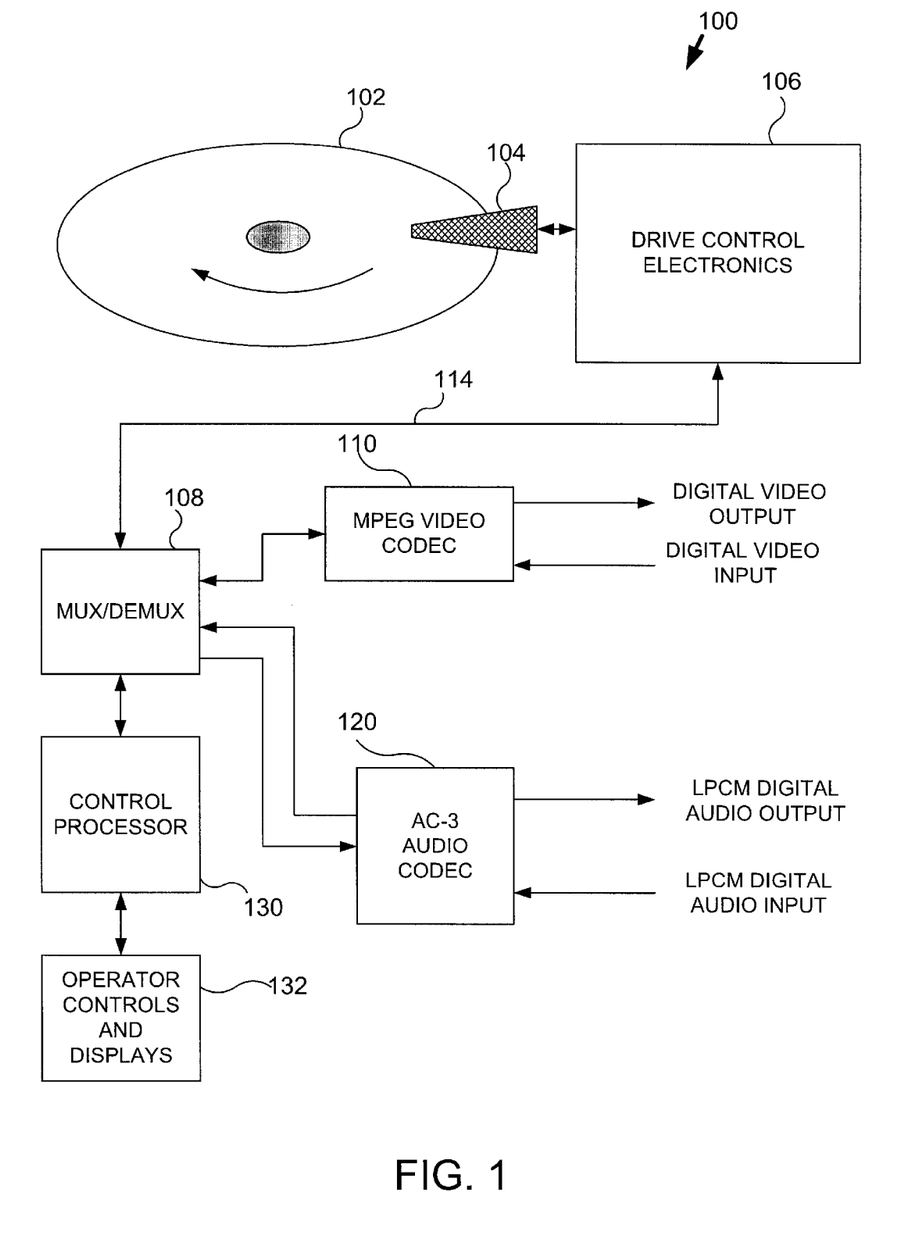
FIG. 1 is a block diagram for one embodiment of a read/write DVD player, in accordance with the present invention.

Referring now to FIG. 1, a block diagram for one embodiment of a read/write DVD player 100 is shown, in accordance with the present invention. In one embodiment, read/write DVD player 100 includes DVD 102, head-arm assembly 104, drive control electronics 106, multiplexor/demultiplexor 108, Motion Picture Experts Group (MPEG) video CODEC 110, audio CODEC 120, control processor 130, and operator controls and displays 132. In one embodiment, DVD 102 is an optical disk platter which contains digital representations of audio and video information. DVD 102 rotates in playback system 100, and the audio and video data on DVD 102 is read by head-arm assembly 104 under control of drive control electronics 106. Drive control electronics 106 extracts a combined audio and video digital bitstream from the information read by head-arm assembly 104 and sends the combined digital bitstream to multiplexor/demultiplexor 108.

Multiplexor/demultiplexor 108 separates the audio and video bitstreams from the combined digital bitstream entering on signal line 114. MPEG video CODEC 110 processes the video bitstream, which is preferably in MPEG-2 format. The video decoded by MPEG video CODEC 110 from the DVD is then put into analog format and sent for display on an external video monitor (not shown). MPEG video CODEC 110 encodes video input from external sources and then sends the encoded video data, via multiplexor/demultiplexor 108, to be written onto DVD 102.

In one embodiment of the present invention, the format for the audio data encoded in the combined digital bitstream on signal line 114 entering multiplexor/demultiplexor 108 is AC-3 audio data. The audio data going to and from DVD 102 on signal line 114 preferably contains AC-3 audio data with 6 distinct channels of audio: 5 full bandwidth (fbw) channels and 1 low frequency effects (lfe) channel.

When DVD 102 is being played back, CODEC 120 receives AC-3 audio data from multiplexor/demultiplexor 108 and decodes it to produce linear pulse-code-modulated (LPCM) audio data. The LPCM data may then be converted to analog signals for reproducing via a traditional stereo system containing amplifiers and loudspeakers.

When DVD 102 is being recorded, CODEC 120 receives incoming LPCM data and encodes the data in AC-3 format. This encoding process is further described in conjunction with FIG. 2 below.

Figure 2:
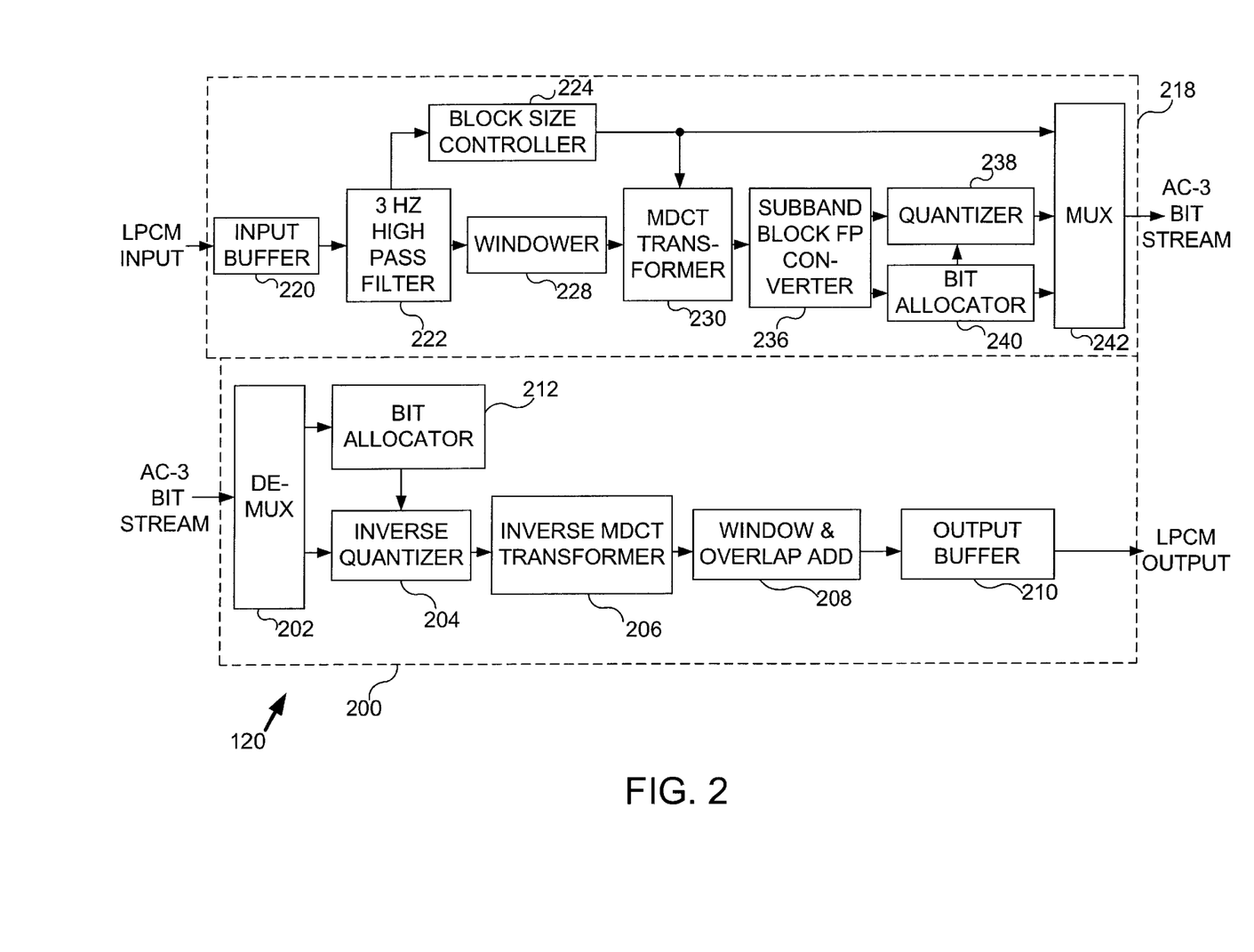
FIG. 2 is a block diagram for one embodiment of the encoder/decoder (CODEC) of FIG. 1, in accordance with the present invention.

Referring now to FIG. 2, a block diagram for one embodiment of the encoder/decoder (CODEC) 120 of FIG. 1 is shown, in accordance with the present invention. In one embodiment, CODEC 120 comprises AC-3 decoder 200 and AC-3 encoder 218.

The detailed design of AC-3 decoder 200 is disclosed in detail in the AC-3 specification that has been incorporated herein by reference. Briefly, in the FIG. 2 embodiment, the incoming multi-channel AC-3 bitstream enters demux 202 which buffers the bitstream data an entire frame at a time, where each frame may encompass a compressed representation of 256 frequency-domain coefficients per channel for up to 6 discrete channels of digital audio. Demux 202 separates compressed frequency-domain coefficients (audio data) from compression control data. Demux 202 also evaluates the incoming bitstream data for errors by providing a shift-register for evaluating CRC1 (the appended-at-the-beginning FCS) and CRC2 (the appended-at-the-end FCS). The quantizer step size control 212 uses the compression control data to determine how to decompress the compressed frequency-domain coefficients. This decompression is performed by the inverse adaptive quantizer 204, which sends uncompressed frequency-domain coefficients to inverse transform 206. Inverse modified-discrete-cosine-transform (MDCT) transformer 206 and window and overlap add 208 together convert the frequency-domain coefficients to time-domain samples. The time-domain samples are then arranged for transmission by output buffer 210.

AC-3 encoder 218 is not described in detail in the AC-3 specification. A general description is given, with details presented only when necessary to ensure the output AC-3 bitstream will be reliably decoded by the standard AC-3 decoder 200. In one embodiment of the present invention, the major circuit blocks of AC-3 encoder 218 include input buffer 220, 3 Hz high pass filter 222, block size controller 224, windower 228, MDCT transformer 230, subband block floating point (FP) converter 236, quantizer 238, bit allocator 240, and multiplexor 242.

Input buffer 220 stores incoming blocks of LPCM digital audio data, and 3 Hz high pass filter 222 filters the data at cutoff frequency 3 Hz. Block size controller 224 determines transient content (the amount of rapid fluctuations in values in a sequence of time-domain samples) to support time-domain aliasing cancellation (TDAC) performed in windower 228 and MDCT transformer 230. When sufficient transient content is determined, block size controller 224 sets the block switch flag, blksw[ch], to 1 and thereby commands MDCT transformer 230 to transform a pair of short blocks rather than an individual long block.

Input buffer 220 sends the digital samples first through 3 Hz high pass filter 222 and thence into windower 228. Windower 228 multiplies the incoming block of digital samples by the Fielder's window (defined in the AC-3 specification) to reduce transform boundary effects and to improve frequency selectivity. After the windowing in the windower 228, the digital samples are ready for time-domain to frequency-domain transformation in MDCT transformer 230. MDCT transformer 230 converts time-domain samples x[n] into frequency-domain coefficients $X_D[k]$.

After MDCT transformer 230 completes the transformation of the time-domain samples into frequency-domain coefficients, the subband block floating-point (FP) converter 236 converts the frequency-domain coefficients into floating-point representation. This floating-point representation includes exponents and mantissas. Subband block FP converter 236 sends the exponents to bit allocator 240, and sends the mantissas to quantizer 238. Bit allocator 240 and quantizer 238 perform the actual data compression by allocating data bits only to those sound components which exceed the masking functions, and by quantizing the data to a finite number of bits. This eliminates the allocation of data bits to sounds which would not be perceived by a human listener. Compression is further enhanced by quantization to the maximum level where quantization error cannot be perceived by a human listener.

Once the frequency-domain coefficients have been compressed, they are sent to multiplexor 242 for packing into AC-3 frames. Multiplexor 242 contains the circuitry necessary to generate and encode both CRC1 (the appended-at-the-beginning FCS) and CRC2 (the appended-at-the-end FCS). The completed AC-3 frames exit encoder 218 from multiplexor 242.

Figure 3:
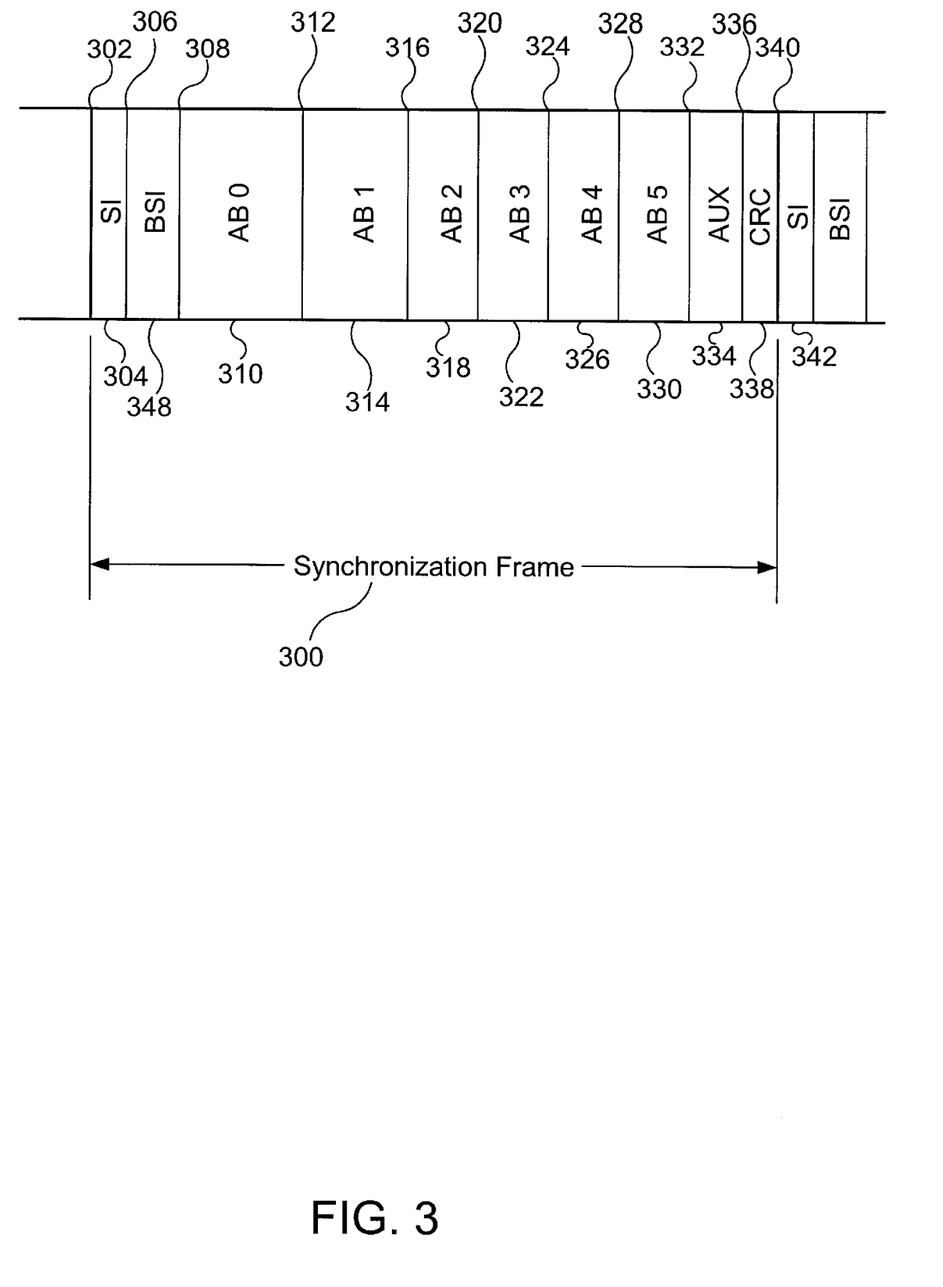
FIG. 3 is a diagram for one embodiment of a synchronization frame, in accordance with the present invention.

Referring now to FIG. 3, a diagram for one embodiment of a synchronization frame 300 is shown, in accordance with the present invention. In the FIG. 3 embodiment of the present invention, synchronization frame 300 is an exemplary frame of digital audio data within a bitstream in AC-3 format. However, having any special type of data contained within synchronization frame 300 is not a requirement for the present invention. Synchronization frame 300 comprises an extended sequence of data words, and, in one embodiment, the data words are transmitted serially with the most-significant-bit of each word transmitted first in time. Each synchronization frame 300 is a unit of the AC-3 bitstream transmitted by multiplexor 242 of FIG. 2.

Time increases from left to right in FIG. 3. At a starting time 302, synchronization frame 300 and, more particularly, synchronization information frame (SI) 304 begins. SI 304 contains that information required to acquire and maintain synchronization, and additionally contains the appended-at-the-beginning FCS, CRC1 (not shown in FIG. 3). Details of SI 304 are further discussed below in conjunction with FIG. 4. At time 306, bitstream information (BSI) 348 begins. BSI 348 contains information required to decode the audio data contained in the subsequent audio blocks. At time 308 begins the first audio block, AB0 310, containing compressed digital audio in frequency-domain format. At subsequent times, the other 5 audio blocks AB1 314, AB2 318, AB3 322, AB4 326, and AB5 330 arrive. Because the digital audio in AB0 310 through AB5 330 may be compressed a varying amount, the size of audio blocks AB0 310 through AB5 330 also may vary. After the audio blocks are through being transmitted, at time 332, an optional auxiliary data field AUX 334 may be appended to the synchronization frame 300. At time 336, all the data has been transmitted, and the cyclic redundancy check (CRC) 338 is transmitted. CRC 338 contains the appended-at-the-end FCS called CRC2. When the optional CRC1 is implemented, CRC2 applies to the final ⅜ of synchronization frame 300. After CRC 338 is transmitted, at time 340, the synchronization frame 300 ends and a subsequent synchronization frame begins with subsequent SI 342.

Figure 4:
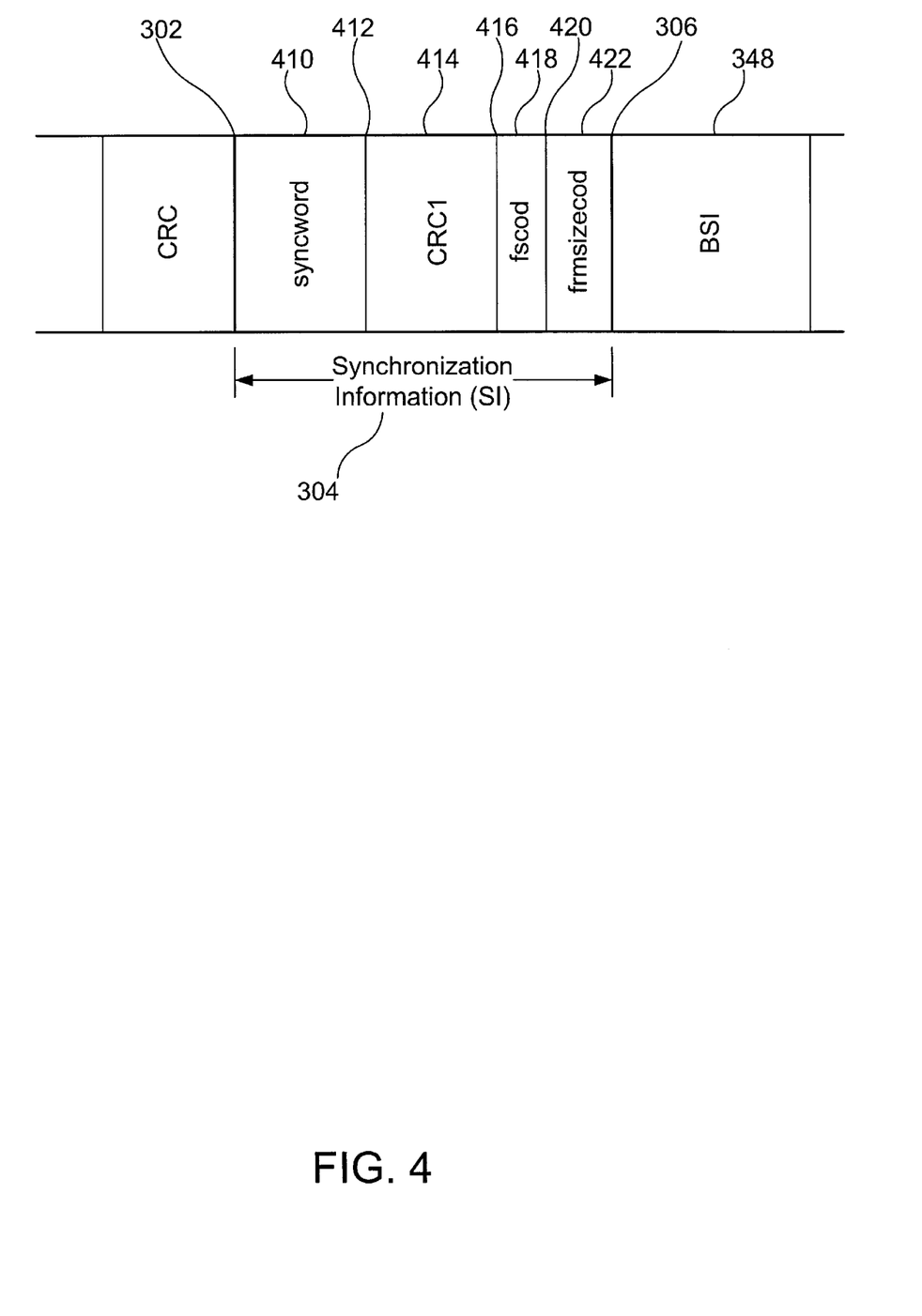
FIG. 4 is a diagram for one embodiment of a synchronization information (SI) header of the synchronization frame of FIG. 3, in accordance with the present invention.

Referring now to FIG. 4, a diagram for one embodiment of a synchronization information (SI) header 304 of synchronization frame 300 of FIG. 3 is shown, in accordance with the present invention. In one embodiment of the present invention, SI 304 contains a synchronization word (syncword) 410, an appended-at-the-beginning FCS (CRC1) 414, a sample rate code (fscod) 418, and a frame size code (frmsizecod) 422. Syncword 410 may be a single 16-bit constant. CRC1 414 may be a 16-bit word which is an appended-at-the-beginning FCS, and which applies to the first ⅝ of synchronization frame 300.

The AC-3 specification requires that audio blocks AB0 310 and AB1 314 be complete within the first ⅝ of synchronization frame 300. Therefore, when AC-3 decoder 200 evaluates CRC1 414 with the first ⅝ of synchronization frame 300, the presence or absence of errors within AB0 310 and AB1 314 may be deduced before the entire synchronization frame 300 is transmitted. Therefore the decoding of AB0 310 and AB1 314 may begin prior to the end of synchronization frame 300, enabling the buffers of AC-3 decoder 200 to be of smaller size than would be necessary if the entire synchronization frame 300 needed to be received prior to determining the presence or absence of errors.

After CRC1 414 is transmitted, at time 416, sample rate code fscod 418 begins. Fscod 418 preferably contains two bits of information that specifies sampling rate information for the original time-domain digital audio samples. Then at time 420 frame size code frmsizecod 422 begins. Frmsizecod 422 preferably contains six bits of information that specifies the number of 16-bit words in every synchronization frame. BSI 348 is transmitted after frmsizecod 422.

Figure 5:
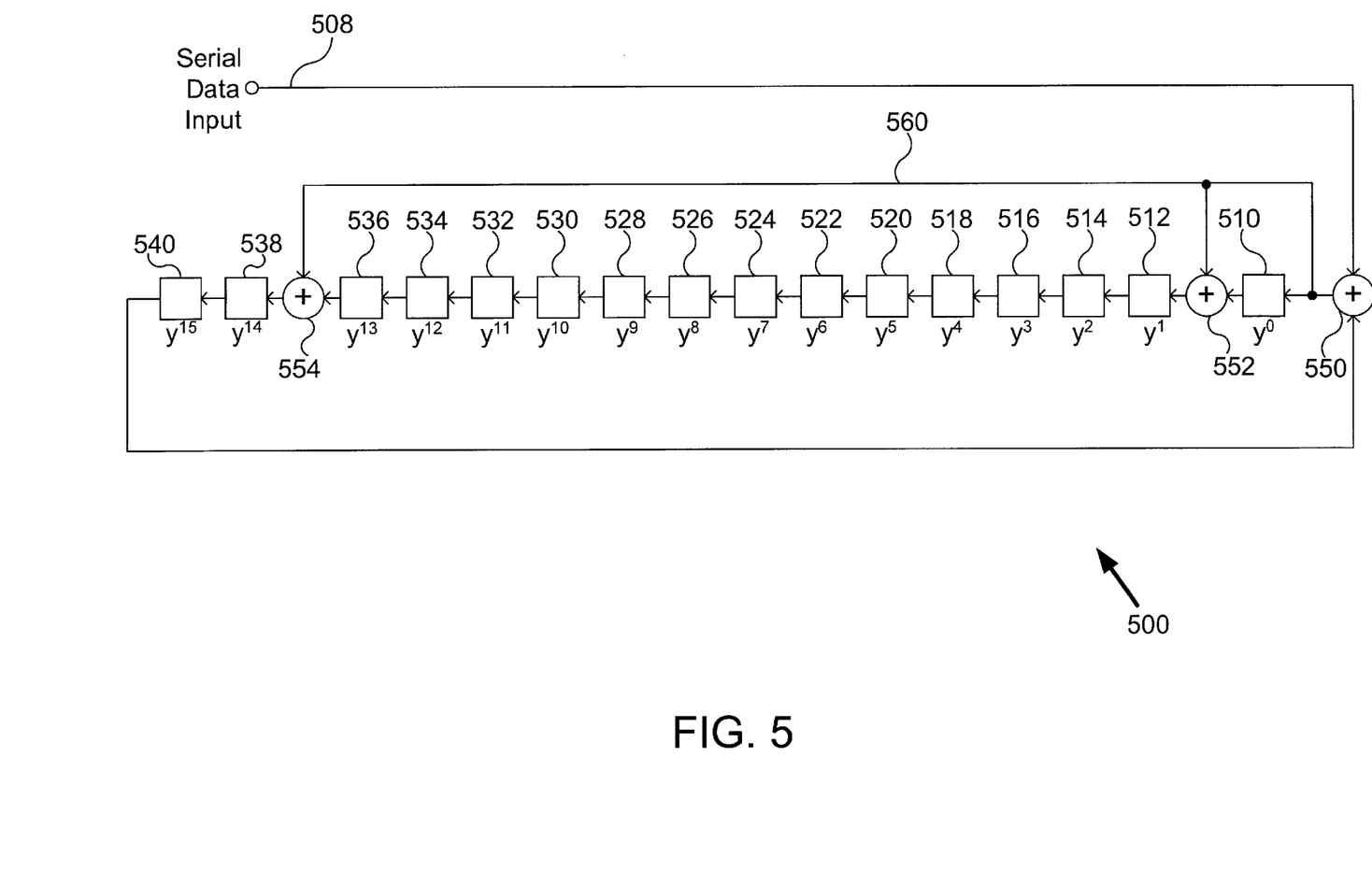
FIG. 5 is a block diagram for a CRC1 calculator shift-register, in accordance with one embodiment of the present invention.

Referring now to FIG. 5, a block diagram for a CRC1 calculator shift-register 500 is shown, in accordance with one embodiment of the present invention. Shift register 500 may be used to calculate a value for CRC1 such that, when that value for CRC1 is appended at the front of a frame of digital data, the first ⅝ of the frame may be correctly evaluated for the presence or absence of errors in an AC-3 decoder 200.

AC-3 decoder 200 evaluates a digital bitstream for errors by treating the frames of digital data in the bitstream as individual binary numbers, with the bit transmitted first-in-time of each frame treated as the most-significant bit (MSB) of a large binary number. This treatment is referred to herein as the forward representation. AC-3 decoder 200 performs this procedure by dividing the previously-appended binary number by an evaluation constant divisor, and checking to see if the remainder is 0. In one embodiment of the present invention, the evaluation constant divisor is 11000000000000101 binary (98,309 decimal), chosen in part for the expected 16-bit remainder. In general, a remainder will be at most 1 degree of polynomial less than a divisor, and therefore this 17-bit divisor yields a remainder capable of representation in 16 bits.

Because working with large binary numbers may be cumbersome, a method known as polynomial representation is often used. A dummy variable x is introduced, where variable x is referred to as a dummy variable because it serves as a placeholder for the exponent. The powers of 2 (which the digits in a binary number represent) are then represented by the exponents of x. Whether a binary digit is a 1 or a 0 is represented by the coefficient of the power of x corresponding to the position of the digit. For example, the above evaluation constant divisor may be represented as $x^{16}+x^{15}+x^2+1$. (When x is set equal to 2, this polynomial then equals the above binary constant divisor.) In the polynomial representation, the constant divisor is called a generating polynomial.

The present invention may be used to determine that number which, when appended at the front of a frame of digital data in a digital bitstream, will give a 0 remainder when the appended frame is divided by the generating polynomial $x^{16}+x^{15}+x^2+1$. In the present invention, a second alternate treatment of the bitstream is used in which the bit transmitted last-in-time in a frame is treated as the MSB of a large binary number. This treatment is referred to herein as the backwards representation. A new dummy variable y is introduced to discuss dividing this backwards representation number to extract remainders. It can be shown mathematically that when a backwards representation number is divided by a generating constant divisor represented by the generating polynomial $y^{16}+y^{14}+y^1+1$ (i.e. 10100000000000011 binary), the resulting remainder may serve as the desired value of CRC1. The resulting remainder, when appended at the front of the first ⅝ of the frame, yields an appended frame in a bitstream which, when treated in the forward representation, divides evenly by the generating polynomial $x^{16}+x^{15}+x^2+1$.

FIG. 5 shows an apparatus which may be used to divide a backwards representation number by the generating polynomial $y^{16}+y^{14}+y^1+1$. In the FIG. 5 embodiment, linear feedback shift-register (LFSR) 500 includes 16 individual latch elements 510 through 540. The instantaneous content of latch element 510 is labeled $y^0$, the instantaneous content of latch element 512 is labeled $y^1$, and the instantaneous content of the remaining latch elements 514 through 540 are labeled $y^2$ through $y^{15}$, respectively. In general, each latch element's data input signal connects to the adjacent latch element's data output signal. Exceptions to this exist for latch element 512 ($y^1$) and latch element 538 ($y^{14}$). In these cases, feedback exclusive-or gates (XOR) 552, 554 add feedback. Latch element 540 ($y^{15}$) feeds its data output via XOR gate 550 into latch element 510 ($y^0$). The output of XOR gate 550 supplies alternate inputs of XOR gates 552 and 554 via feedback line 560.

In the FIG. 5 embodiment, LFSR 500 operates in the following manner. The data bits that form the first ⅝ of an exemplary synchronization frame 300 are received and stored in a buffer (not shown). The latch elements 510 through 540 are reset to each contain 0. The buffer then presents the data bits to serial data input line 508 in the reverse order in which the buffer received the data bits. When serial data input line receives each new data bit, then each latch element 510 through 540 receives a clock pulse to advance the previously received data bits in LFSR 500. When the last data bit from the buffer is clocked into latch element 510 via XOR gate 550, LFSR 500 then contains 16 data bits which correspond to the remainder of the division of the first ⅝ of data in the exemplary synchronization frame (treated as a binary number in backwards representation) by the backwards representation generating polynomial $y^{16}+y^{14}+y_1+1$.

The data bits in latch elements 510 through 540 are then written into CRC1 414, with data bit $y^0$ in latch element 510 used as the most-significant bit of CRC1 414, with data bit $y^1$ in latch element 512 used as the second-most-significant bit of CRC1 414, and with the remaining data bits $y^2$ through $y^{15}$ in latch elements 514 through 540, respectively, used as the third-most-significant through fifteenth-most-significant bits of CRC1 414. With the calculation of CRC1 414 and CRC 336 complete, AC-3 encoder 218 may then proceed with transmitting synchronization frame 300 as the next frame in the AC-3 bitstream.

The LFSR 500 of FIG. 5 has been specifically described herein with a particular embodiment's generating polynomial $y^{16}+y^{14}+y^1+1$ for data in the backwards representation, and corresponding generating polynomial $x^{16}+x^{15}+x^2+1$ for data in the forward representation. The generating polynomial $x^{16}+x^{15}+x^2+1$ is commonly used because, among other reasons, it is a prime polynomial representing a prime number divisor. Using a prime number divisor may result in a more efficient implementation. However, alternate embodiments of the present invention may utilize any $n^{th}$-order polynomial in dummy variable x as a generating polynomial g(x). In general, for an $n^{th}$-order generating polynomial g(x) for data in the forward representation, it may be shown mathematically that the corresponding generating polynomial ĝ(y) for data in the backwards representation may be given by $ĝ(y)=y^n(g(y^{-1}))$. The LFSR for ĝ(y) may be constructed in a similar manner as that shown in FIG. 5, with n latch elements and with XOR gates adding feedback. The XOR gates will be placed at the data inputs of latch 25 elements at locations corresponding to those $y^m$ with non-zero coefficients, for n<m<0.

Additionally, the LFSR 500 of FIG. 5 has been specifically described herein with a particular embodiment's calculating an FCS for a specified initial portion of a frame of digital data, specifically in the case where the specified portion of the frame is the first ⅝ of the frame. This requirement for a specified portion arises solely from the AC-3 specification, and the present invention is not limited by that requirement. The present invention, in alternate embodiments, may be used to calculate an FCS for an entire frame of digital data, or for any initial portion thereof.

Figure 6A:
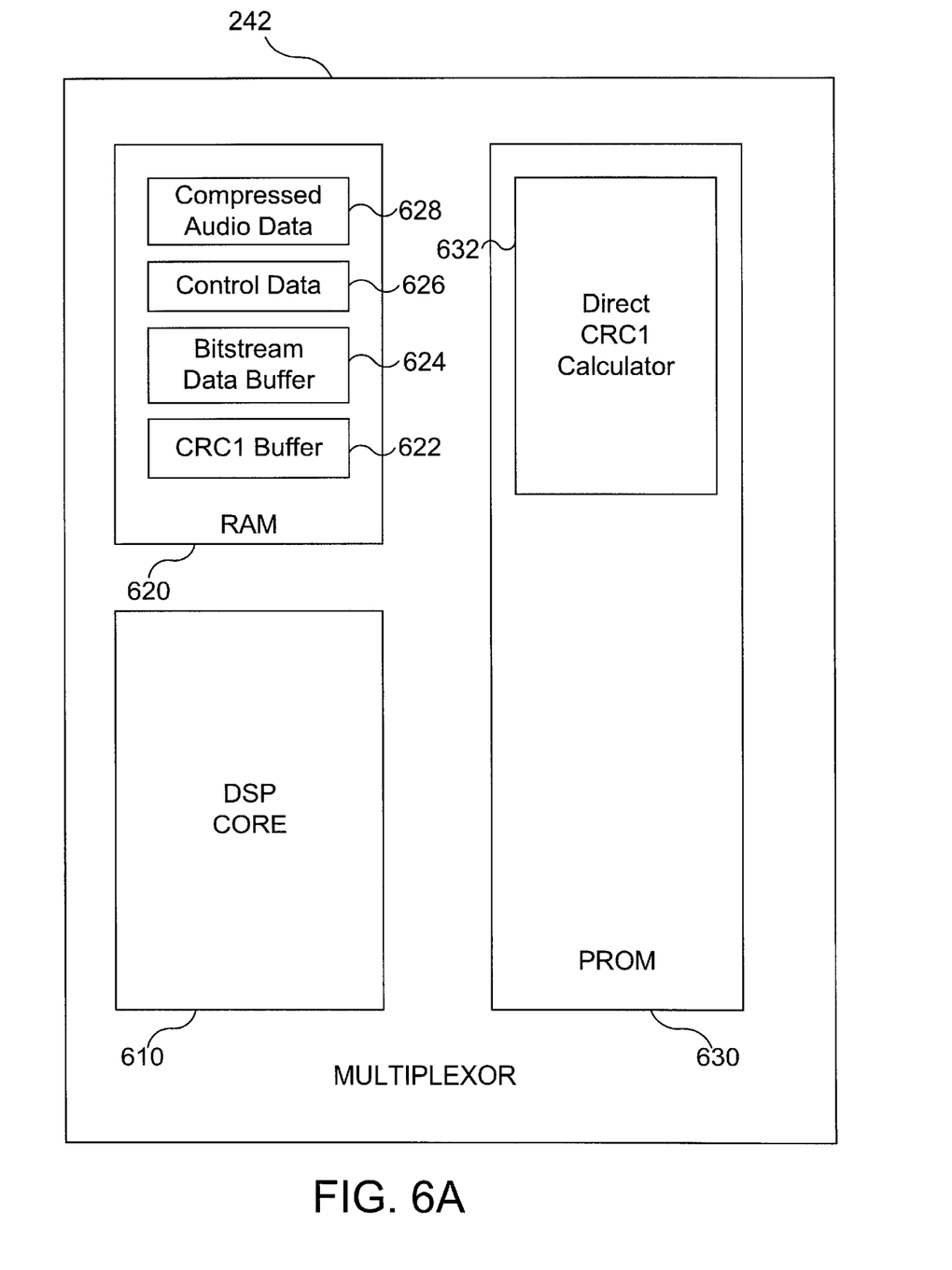
FIG. 6A is a block diagram for a direct CRC1 calculator digital processor, in accordance with one embodiment of the present invention.

Referring now to FIG. 6A, a block diagram for a direct CRC1 calculator digital processor is shown, in accordance with one embodiment of the present invention. In the event that a designer wishes to avoid the additional hardware involved in implementing LFSR 500 of FIG. 5, the designer may readily implement the invention in software on a microprocessor. FIG. 6A shows one implementation of multiplexor 242 of AC-3 encoder 218. In the FIG. 6A embodiment, software module direct CRC1 calculator 632 resides in programmable read-only memory (PROM) 630 and executes on digital signal processor (DSP) core 610. Multiplexor 242 receives and buffers control data in control data buffer 626 and compressed audio data in compressed audio data buffer 628. Multiplexor 242 then later generates and transmits bitstream data from bitstream data buffer 624. When the first ⅝ of the synchronization frame data is available in bitstream data buffer 624, direct CRC1 calculator 632 may calculate the required value for CRC1.

In one embodiment, direct CRC1 calculator 632 interprets the first ⅝ of the synchronization frame as a single large binary number in backwards representation. CRC1 calculator 632 then executes on DSP core 610 to divide the backwards representation number by 10100000000000011 binary (i.e. by generating polynomial $y^{16}+y^{14}+y^1+1$). The remainder value from this division is stored in reverse bit order in CRC1 buffer 622. Once this remainder value is stored in CRC1 buffer 622, and frequently after calculating the appended-at-the-end CRC FCS, multiplexor 242 may begin transmitting the AC-3 synchronization frame, appending the value for CRC1 in CRC1 buffer 622 at the beginning of the corresponding frame.

Figure 6B:
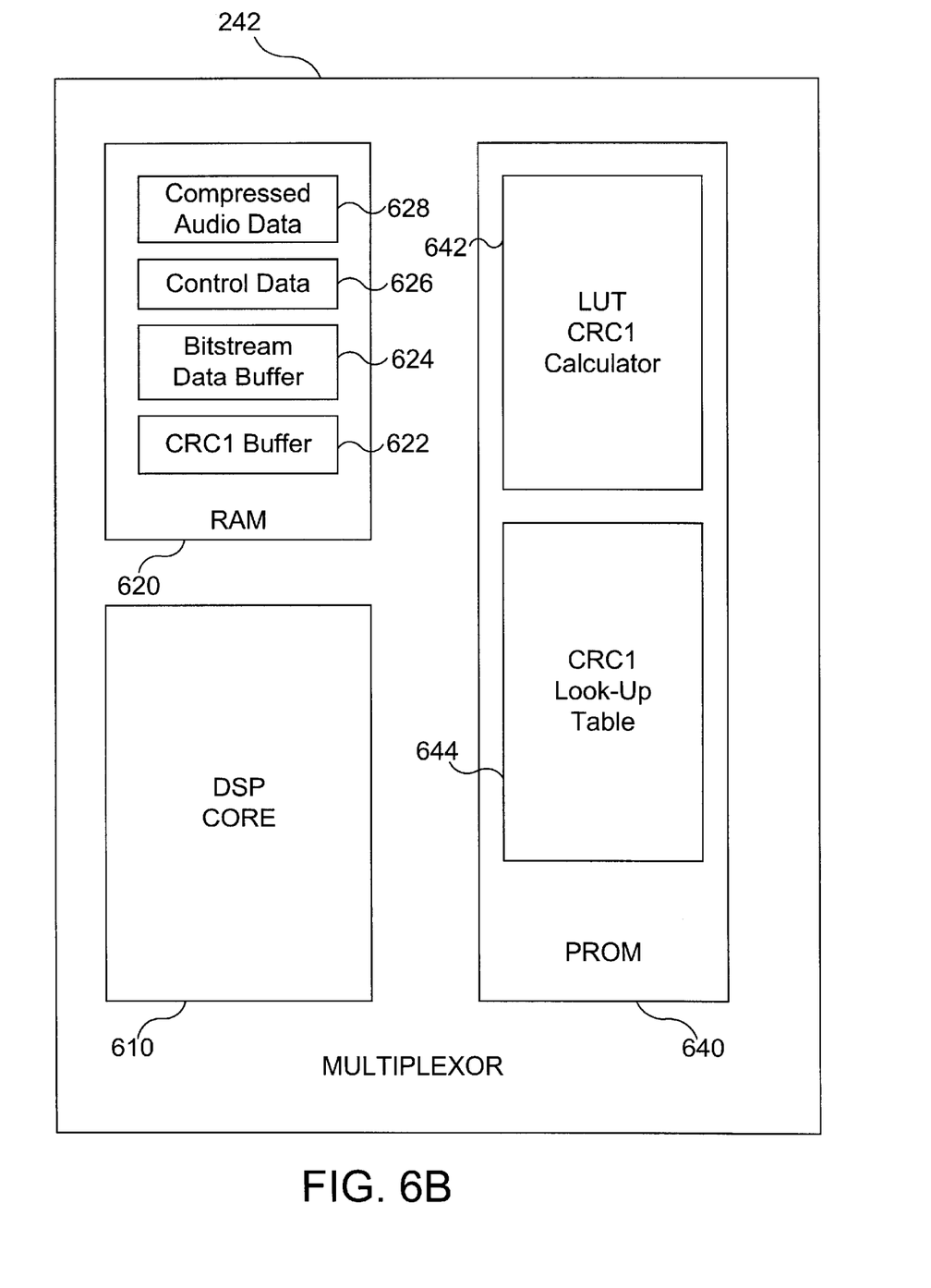
FIG. 6B is a block diagram for a look-up table CRC1 calculator digital processor, in accordance with one embodiment of the present invention.

Referring now to FIG. 6B, a block diagram for a look-up table CRC1 calculator 642 digital processor is shown, in accordance with one embodiment of the present invention. The FIG. 6A implementation requires substantial processing capability for a direct calculation of CRC1. Therefore, in the FIG. 6B implementation, partial calculations for CRC1 are stored in CRC1 look-up table (LUT) 644 within PROM 640, and LUT CRC1 calculator 642 may retrieve these partial calculations from CRC1 LUT 644 in support of an iterative calculation of CRC1. By performing many of the calculations once during the design of CRC1 LUT 664, the amount of calculations required during the calculation of CRC1 is substantially reduced.

The following code example I illustrates a realization of LUT CRC1 calculator 642. Pseudo-code represents a listing of computer software source code that is written to serve as an example, and is not guaranteed to compile under an actual compiler. Code example I is written in a pseudo-code which adopts the conventions of the "C" programming language.

CODE EXAMPLE I

```
short lut_crc1(short start, short end)
{
    syndrome = 0;
    for(i=end-1; i >= start; i--)
    {
        syndrome=(short)(((syndrome >> 8) & 0xff)
            ^ (((outbuf[i] 0xff)<<8) ^ crctab1[syndrome & 0xff]));
        syndrome=(short)(((syndrome >> 8) & 0xff)
            ^ ((outbuf[i] & 0xff00) ^ crctab1[syndrome & 0xff]));
    }
    return syndrome;
}
```

The exemplary software of code example I includes several defined variables. Here "end" is the word number of the last-received word in bitstream data buffer 624, "start" is the word number of the first-received word in bitstream data buffer 624, "outbuf[i]" is the contents of the i'th word in bitstream data buffer 624, "syndrome" is the variable which will become CRC1, and array value crctab 1[x] is the x'th entry in CRC1 look-up table 644. The exemplary software of code example I also includes the bitwise operators A>>B (bitwise right shift A by amount B), A<<B (bitwise left shift A by amount B), & (bitwise "and"), and ^ (bitwise exclusive-or).

Code example I describes a function called "lut_crc1" of "end" and "start" which returns "syndrome". When the function "lut_crc1" is called, the first ⅝ of the synchronization frame is stored in bitstream data buffer 624. Code example I initializes "syndrome" to equal 0. Then "syndrome" is updated for each 16-bit word in bitstream data buffer 624, starting with the last-received word at outbuf [end-1] and proceeding through outbuf[end-2], outbuf[end-3], and the other 16-bit words until outbuf[start] is reached. After outbuf[start] is processed, "syndrome" contains the desired value of CRC1.

The method illustrated in code example I performs calculations first on the least-significant byte of each word outbuf[i], and then performs calculations on the most-significant byte of each word outbuf[i]. The method separates the least-significant byte or most-significant byte by forming the bitwise "and" of the 16-bit word outbuf[i] with a constant mask of 00ff hexadecimal (hex) or ff00 hex, respectively. Recall in synchronization frame 300 of FIG. 3 that the most-significant-bits of each word is transmitted first in time. Therefore, the FIG. 6B embodiment operates on the least-significant byte first in order to process the bits in reverse time order. By operating on the least-significant byte first, the calculations of the FIG. 6B embodiment correspond to the backwards representation processing of the FIG. 5 embodiment.

Figure 7:
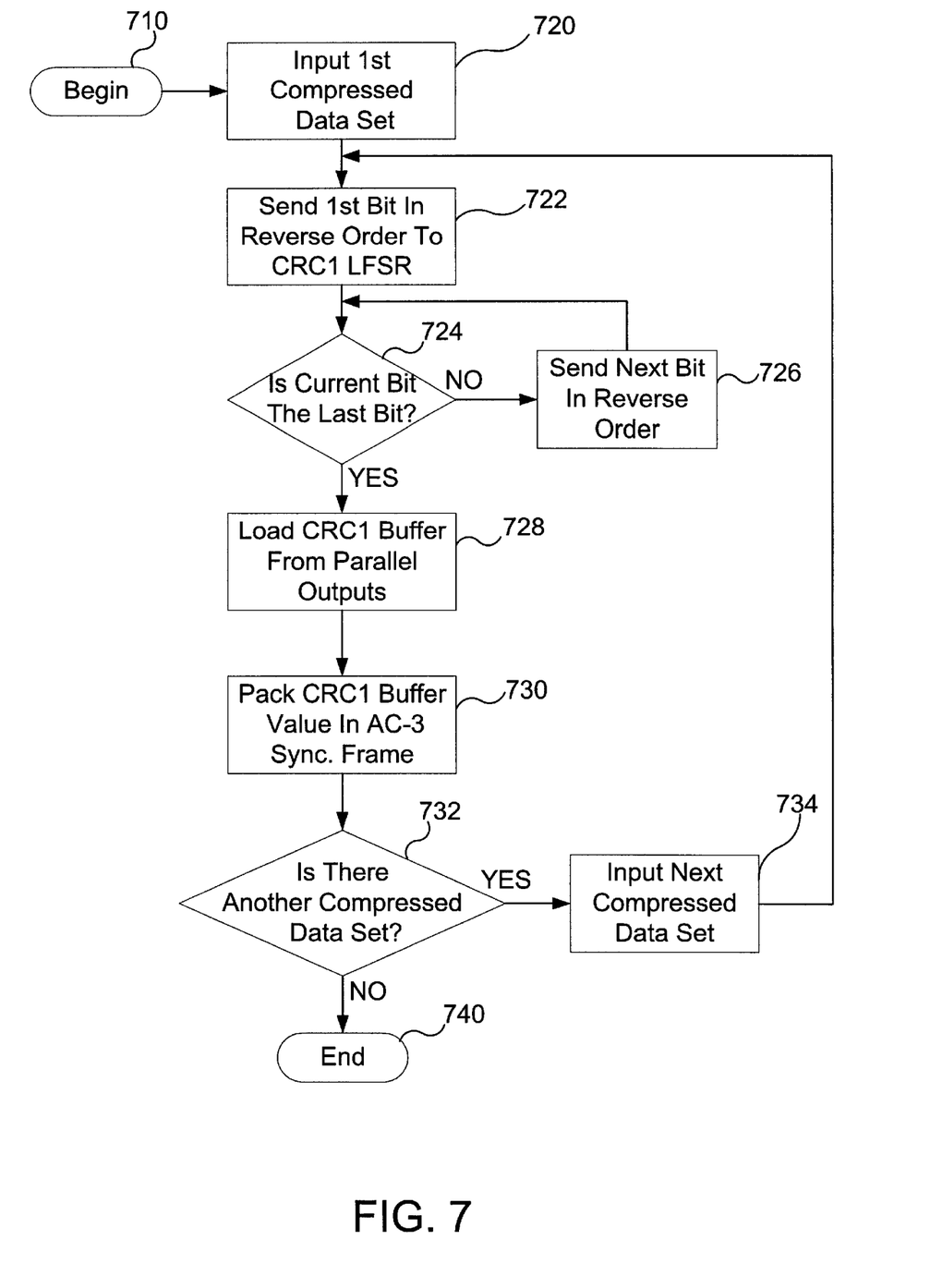
FIG. 7 is a flowchart for one embodiment of method steps for computing and encoding error detection sequences, in accordance with the present invention.

Furthermore, the performing of the calculations on one byte at a time in the FIG. 6B embodiment beneficially reduces the required memory size for CRC1 look-up table 644. There are approximately 64,000 permutations of 16 bits, whereas there are only 256 permutations of 8 bits (1 byte). An exemplary Table I, which contains partial calculations that may be used as CRC1 look-up table 644 of FIG. 6B (array crctab 1 in code example I above), is shown below as Table I. In alternate embodiments of the present invention, other arrays of numbers could be used.

audio data corresponding to the first synchronization frame, multiplexor 242 may derive the number of bits in the synchronization frame, and then locate the last bit in the first ⅝ of the synchronization frame. Then, in step 722, multiplexor 242 preloads LFSR 500 to contain all 0 values, and then sends this last bit in the first ⅝ of the synchronization frame as the first bit sent in reverse time order to the serial data input line 508 of LFSR 500.

Multiplexor 242 then, in step 724, determines whether the bit just sent (in step 722 or in step 726) is the last bit available to be sent (in reverse time order). If not, then the process exits step 724 via the NO branch, and, in step 726, multiplexor 242 sends the next bit in reverse time order to the serial data input line 508. After each bit has been sent, in step 726, to the serial data input line 508 of LFSR 500, multiplexor 242 determines, in step 724, whether the bit just sent is the last bit available to be sent (in reverse time order).

When multiplexor 242, in step 724, determines that the bit just sent is the final bit to be sent in reverse time order (in other words, the bit just sent is the first bit intended to follow CRC1 for the current synchronization frame), then the FIG. 7 process exits step 724 via the YES branch. Then, in step 728, multiplexor 242 reads in parallel the data contained

TABLE I

```
unsigned short crctab1[256] =
{
0x0000,   0
0xfc02,   0x8383, 0x0300, 0x7c81, 0x8203, 0xfd82, 0x7d01, 0x0280,
0x7801,   0x0780, 0x8703, 0xf882, 0x0600, 0x7981, 0xf902, 0x8683,
0x8403,   0xfb82, 0x7b01, 0x0480, 0xfa02, 0x8583, 0x0500, 0x7a81,
0xf002,   0x8f83, 0x0f00, 0x7081, 0x8e03, 0xf182, 0x7101, 0x0e80,
0x0c00,   0x7381, 0xf302, 0x8c83, 0x7201, 0x0d80, 0x8d03, 0xf282,
0x8803,   0xf782, 0x7701, 0x0880, 0xf602, 0x8983, 0x0900, 0x7681,
0x7401,   0x0b80, 0x8b03, 0xf482, 0x0a00, 0x7581, 0xf502, 0x8a83,
0x6001,   0x1f80, 0x9f03, 0xe082, 0x1e00, 0x6181, 0xe102, 0x9e83,
0x9c03,   0xe382, 0x6301, 0x1c80, 0xe202, 0x9d83, 0x1d00, 0x6281,
0x1800,   0x6781, 0xe702, 0x9883, 0x6601, 0x1980, 0x9903, 0xe682,
0xe402,   0x9b83, 0x1b00, 0x6481, 0x9a03, 0xe582, 0x6501, 0x1a80,
0x9003,   0xef82, 0x6f01, 0x1080, 0xee02, 0x9183, 0x1100, 0x6e81,
0x6c01,   0x1380, 0x9303, 0xec82, 0x1200, 0x6d81, 0xed02, 0x9283,
0xe802,   0x9783, 0x1700, 0x6881, 0x9603, 0xe982, 0x6901, 0x1680,
0x1400,   0x6b81, 0xeb02, 0x9483, 0x6a01, 0x1580, 0x9503, 0xea82,
0xc002,   0xbf83, 0x3f00, 0x4081, 0xbe03, 0xc182, 0x4101, 0x3e80,
0x3c00,   0x4381, 0xc302, 0xbc83, 0x4201, 0x3d80, 0xbd03, 0xc282,
0xb803,   0xc782, 0x4701, 0x3880, 0xc602, 0xb983, 0x3900, 0x4681,
0x4401,   0x3b80, 0xbb03, 0xc482, 0x3a00, 0x4581, 0xc502, 0xba83,
0x3000,   0x4f81, 0xcf02, 0xb083, 0x4e01, 0x3180, 0xb103, 0xce82,
0xcc02,   0xb383, 0x3300, 0x4c81, 0xb203, 0xcd82, 0x4d01, 0x3280,
0x4801,   0x3780, 0xb703, 0xc882, 0x3600, 0x4981, 0xc902, 0xb683,
0xb403,   0xcb82, 0x4b01, 0x3480, 0xca02, 0xb583, 0x3500, 0x4a81,
0xa003,   0xdf82, 0x5f01, 0x2080, 0xde02, 0xa183, 0x2100, 0x5e81,
0x5c01,   0x2380, 0xa303, 0xdc82, 0x2200, 0x5d81, 0xdd02, 0xa283,
0xd802,   0xa783, 0x2700, 0x5881, 0xa603, 0xd982, 0x5901, 0x2680,
0x2400,   0x5b81, 0xdb02, 0xa483, 0x5a01, 0x2580, 0xa503, 0xda82,
0x5001,   0x2f80, 0xaf03, 0xd082, 0x2e00, 0x5181, 0xd102, 0xae83,
0xac03,   0xd382, 0x5301, 0x2c80, 0xd202, 0xad83, 0x2d00, 0x5281,
0x2800,   0x5781, 0xd702, 0xa883, 0x5601, 0x2980, 0xa903, 0xd682,
0xd402,   0xab83, 0x2b00, 0x5481, 0xaa03, 0xd582, 0x5501, 0x2a80,
};
```

Referring now to FIG. 7, a flowchart for one embodiment of method steps for computing and encoding error detection sequences is shown, in accordance with the present invention. The flowchart of FIG. 7 preferably describes the activity within multiplexor 242 of AC-3 encoder 218. When AC-3 encoder 218 is initialized, it begins to encode the input LPCM audio input. At this point, at step 710, multiplexor 242 begins deriving the values for CRC1. Multiplexor 242 first, in step 720, receives and buffers the first compressed audio data set corresponding to the first synchronization frame. Once multiplexor 242 contains all of the compressed within latch elements 510 through 540 and loads a CRC1 buffer with the data read from these parallel outputs. Then, in step 730, multiplexor 242 may pack the contents of the CRC1 buffer into the appropriate field and transmit the entire AC-3 synchronization frame, with CRC1 correctly appended at the front.

In step 732, multiplexor 242 determines whether another compressed data set is available (corresponding to a subsequent set of audio data in LPCM format having been sent to AC-3 encoder 218). If so, then the FIG. 7 process exits step 732 via the YES branch. Then, in step 734, multiplexor 242 inputs and buffers this next compressed data set, corresponding to the subsequent synchronization frame, and the FIG. 7 process of determining a value for CRC1 repeats. If, however, multiplexor 242 determines there is no subsequent set of audio data, then the FIG. 7 process exits step 732 via the NO branch and the FIG. 7 process terminates.

The invention has been explained above with reference to a preferred embodiment. Other embodiments will be apparent to those skilled in the art in light of this disclosure. For example, the present invention may readily be implemented using configurations and techniques other than those described in the preferred embodiment above. Additionally, the present invention may effectively be used in conjunction with systems other than the one described above as the preferred embodiment. Therefore, these and other variations upon the preferred embodiments are intended to be covered by the present invention, which is limited only by the appended claims.

What is claimed is:

1. A calculator for calculating a frame check sequence, comprising:
   a shift register including feedback configured for binary division; and
   means for sending data bits to said shift register in reverse time order, wherein said frame check sequence is an appended-at-the-beginning frame check sequence, and wherein said frame check sequence can be evaluated in a circuit designed to evaluate appended-at-the-end frame check sequences.

2. The calculator of claim 1, wherein said calculator is implemented with a digital audio encoder/decoder.

3. The calculator of claim 2, wherein said encoder/decoder encodes said digital audio in AC-3 format.

4. The calculator of claim 1, wherein said shift register is configured to divide a backwards representation number by a first generating polynomial.

5. The calculator of claim 4, wherein said first generating polynomial is $y^{16}+y^{14}+y^1+1$, where y is a dummy variable for backwards representation numbers.

6. The calculator of claim 4, wherein said circuit divides by a second generating polynomial g(x), and wherein said first generating polynomial is $\hat{g}(y)$, where $\hat{g}(y)=y^n(g(y^{-1}))$, n is the order of g(x), x is a dummy variable for forwards representation numbers, and y is a dummy variable for backwards representation numbers.

7. The calculator of claim 4, wherein said feedback is generated by exclusive-or gates coupled to latch elements of said shift register.

8. The calculator of claim 7, wherein said exclusive-or gates are coupled to latch elements corresponding to positions in said first generating polynomial with coefficients equal to 1.

9. The calculator of claim 7, wherein said frame check sequence is read from said latch elements.

10. A method for calculating frame check sequences, comprising the steps of:
    sending data bits to a shift register in reverse time order; and
    shifting data bits in said shift register, wherein said shift register is configured for binary division, including feedback, wherein said frame check sequences are appended-at-the-beginning frame check sequence, and wherein said frame check sequences can be evaluated in a circuit designed to evaluate appended-at-the-end frame check sequences.

11. The method of claim 10, wherein said shift register is configured to divide a backwards representation number by a first generating polynomial.

12. The method of claim 11, wherein said encoder/decoder encodes said digital audio in AC-3 format.

13. The method claim of claim 10, wherein said shift register is configured to divide a backwards representation number by a first generating polynomial.

14. The method of claim 13, wherein said first generating polynomial is $y^{16}+y^{14}+y^1+1$, where y is a dummy variable for backwards representation numbers.

15. The method of claim 13, wherein said circuit divides by a second generating polynomial g(x), and wherein said first generating polynomial is $\hat{g}(y)$, where $\hat{g}(y)=y^n(g(y^{-1}))$, n is the order of g(x), x is a dummy variable for forwards representation numbers, and y is a dummy variable for backwards representation numbers.

16. The method of claim 13, wherein said feedback is generated by exclusive-or gates coupled to latch elements of said shift register.

17. The method of claim 16, wherein said exclusive-or gates are coupled to said latch elements corresponding to those terms in said first generating polynomial with coefficients equal to 1.

18. The method of claim 16, wherein said frame check sequence is read from said latch elements.

19. A method for calculating frame check sequences, comprising the steps of:
    storing data bits of a frame of digital data;
    interpreting said data bits as a backwards representation number; and
    dividing said backwards representation number by a constant, wherein said frame check sequences are appended-at-the-beginning frame check sequences, and wherein said frame check sequences can be evaluated in a circuit designed to evaluate appended-at-the-end frame check sequences.

20. The calculator of claim 19, wherein said method is performed by a digital audio encoder/decoder.

21. The method of claim 20, wherein said encoder/decoder encodes said digital audio in AC-3 format.

22. The method of claim 19, wherein said constant is a first generating polynomial.

23. The method of claim 22, wherein said first generating polynomial is $y^{16}+y^{14}+y^1+1$, where y is a dummy variable for said backwards representation number.

24. The method of claim 22, wherein said circuit divides by a second generating polynomial g(x), and wherein said first generating polynomial is $\hat{g}(y)$, where $\hat{g}(y)=y^n(g(y^{-1}))$, n is the order of g(x), x is a dummy variable for forwards representation numbers, and y is a dummy variable for backwards representation numbers.

25. The method of claim 22, wherein said step of dividing said backwards representation number includes utilizing a look-up table.

26. The method of claim 25, wherein said look-up table is configured to store partial calculations of performing said step of dividing said backwards representation number on least-significant bytes and most-significant bytes of said backwards representation number.

27. The method of claim 25, wherein said step of dividing said backwards representation number includes separating least-significant bytes and most-significant bytes with a mask.

28. A computer-readable medium comprising program instructions for calculating frame check sequences, by performing the steps of:

storing data bits of a frame of digital data;

interpreting said data bits as a backwards representation number; and dividing said backwards representation number by a constant, wherein said frame check sequences are appended-at-the-beginning frame check sequences, and wherein said frame check sequences can be evaluated in a circuit designed to evaluate appended-at-the-end frame check sequences.

29. A device for calculating frame check sequences, comprising:

means for sending data bits to a shift register in reverse time order; and means for shifting data bits in said shift register, wherein said shift register is configured for binary division, including feedback, wherein said frame check sequences are appended-at-the-beginning frame check sequences, and wherein said frame check sequences can be evaluated in a circuit designed to evaluate appended-at-the-end frame check sequences.

30. A device for calculating frame check sequences, comprising:

means for storing data bits of a frame of digital data;

means for interpreting said data bits as a backwards representation number; and means for dividing said backwards representation number by a constant, wherein said frame check sequences are appended-at-the-beginning frame check sequences, and wherein said frame check sequences can be evaluated in a circuit designed to evaluate appended-at-the-end frame check sequences.

* * * * *